(12) United States Patent
Sasaki (10) Patent No.: US 10,794,635 B2
(45) Date of Patent: Oct. 6, 2020

(54) HEAT PIPE

(71) Applicant: FURUKAWA ELECTRIC CO., LTD., Tokyo (JP)

(72) Inventor: Yasumi Sasaki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 128 days.

(21) Appl. No.: 16/021,395

(22) Filed: Jun. 28, 2018

(65) Prior Publication Data

US 2018/0313611 A1 Nov. 1, 2018

Related U.S. Application Data

(63) Continuation of application No. PCT/JP2016/088817, filed on Dec. 27, 2016.

(30) Foreign Application Priority Data

Dec. 28, 2015 (JP) ................... 2015-255986

(51) Int. Cl.
*F28F 7/00* (2006.01)
*F28D 15/04* (2006.01)
(Continued)

(52) U.S. Cl.
CPC ....... *F28D 15/046* (2013.01); *F28D 15/0233* (2013.01); *H01L 23/427* (2013.01); *H01L 23/3672* (2013.01)

(58) Field of Classification Search
CPC .... F28D 15/046; F28D 15/0233; F28D 15/04; H01L 23/427; H01L 23/3672
See application file for complete search history.

(56) References Cited

U.S. PATENT DOCUMENTS

2009/0219695 A1 9/2009 Tomioka
2011/0174465 A1* 7/2011 Liu ................... F28D 15/046
165/104.26
(Continued)

FOREIGN PATENT DOCUMENTS

JP 2009-204254 A 9/2009
JP 2011-43320 A 3/2011
(Continued)

OTHER PUBLICATIONS

Japanese Office Action dated Jun. 3, 2019, in a counterpart Japanese patent application No. 2017-559188. (A machine translation (not reviewed for accuracy) attached.).
(Continued)

*Primary Examiner* — Henry T Crenshaw
*Assistant Examiner* — Kamran Tavakoldavani
(74) *Attorney, Agent, or Firm* — Chen Yoshimura LLP (57) ABSTRACT

A heat pipe has a flat container; a wick structure housed inside the flat container; and a working fluid sealed inside the flat container, wherein in at least one cross section of the flat container, the wick structure contacts both of the pair of flat inner surfaces of the flat container, and both side faces of the wick structure do not contact any of the inner surfaces of the flat container, wherein the wick structure has a first wick part and a second wick part, respectively disposed in the lengthwise direction of the flat container, the second wick part being directly or indirectly connected to the first wick part and having a maximum width that is wider than a maximum width of the first wick part, and wherein the second wick part is disposed in the heat receiving portion of the heat pipe.

14 Claims, 9 Drawing Sheets

(51) Int. Cl.
  *H01L 23/427* (2006.01)
  *F28D 15/02* (2006.01)
  *H01L 23/367* (2006.01)

(56) References Cited

U.S. PATENT DOCUMENTS

| | | | | |
|---|---|---|---|---|
| 2012/0118537 A1* | 5/2012 | Kameoka | ............... | F28D 15/04 |
| | | | | 165/104.26 |
| 2014/0055954 A1* | 2/2014 | Wu | .................. | F28D 15/04 |
| | | | | 361/700 |
| 2015/0114604 A1 | 4/2015 | Pai | | |
| 2016/0153723 A1* | 6/2016 | Huang | ................. | F28D 15/046 |
| | | | | 165/104.26 |

FOREIGN PATENT DOCUMENTS

| TW | 289653 B | 11/2007 |
|---|---|---|
| TW | M375861 U1 | 3/2010 |
| TW | 201516367 A | 5/2015 |

OTHER PUBLICATIONS

International Search Report (ISR) issued in PCT/JP2016/088817 dated Apr. 2017.
Written Opinion (PCT/ISA/237) issued in PCT/JP2016/088817 dated Apr. 2017. Concise Explanation of Relevance: This Written Opinion considers that the some of claims are not described by or obvious over the references U.S. Patent Publication Nos. 2 and 4 and Foreign Patent Document No. 2 cited in ISR above.).
Taiwanese Office Action dated Aug. 7, 2017, in a counterpart Taiwanese patent application No. 105143522.
Taiwanese Approval Decision Letter dated May 15, 2018, in a counterpart Taiwanese patent application No. 105143522.
English translation of Written Opinion (PCT/ISA/237) issued in PCT/JP2016/088817 dated Apr. 2017.
Chinese Office Action dated Dec. 6, 2018, in a counterpart Chinese patent application No. 201690001480.6.

* cited by examiner

HEAT PIPE

BACKGROUND OF THE INVENTION

Technical Field

The present invention relates to a thin heat pipe having a favorable maximum heat transport amount, low thermal resistance, and excellent heat transport characteristics.

Background Art

Electronic components, such as semiconductor elements, that are mounted on electronic devices have increased in the amount of heat generated due to higher mounting density associated with higher performance, and thus cooling of the components has become more important. One method for cooling electronic components is to use a heat pipe.

Due to narrowing of the installation area for the heat pipe caused by the higher mounting density of the electronic components, and due to the smaller size of the electronic components, there is demand for flat heat pipes, such as a thin heat pipe that has a thickness of 1.5 mm or below. There has been a proposal for a thin heat pipe that uses a wick having a main body and a first protruding part extending from the main body. The first protruding part divides the inside of a heat-receiving part into a first section communicating with a steam flow path and a second section communicating with a liquid return flow path, and the heat-receiving part is thermally connected to a heat generating component at a location straddling the first section and the first protruding part (Patent Document 1).

In Patent Document 1, the boundary between the first protruding part and second section can be disposed in a position far away from the heat generating component, which thus prevents an increase in pressure loss in this direction and the flowing of air bubbles in evaporated working fluid in this direction. By extension, this prevents a reverse flow being generated in the working fluid and inhibits a reduction in heat transport efficiency, even if a plurality of heat generating components are provided.

However, the thin heat pipe in Patent Document 1 is problematic in that it is not possible to attain both an improvement in the maximum heat transport amount and a reduction in thermal resistance; i.e., if the maximum heat transport amount is increased, then thermal resistance also increases, and if thermal resistance is decreased, then the maximum heat transport amount also decreases. Thus, the thin heat pipe of Patent Document 1 still had these aforementioned issues, which have a particularly marked occurrence when the heat pipe is thin.

RELATED ART DOCUMENT

Patent Document

Patent Document 1: Japanese Patent Application Laid-Open Publication No. 2009-204254

SUMMARY OF THE INVENTION

In view of the issues described above, the present invention aims at providing a heat pipe that has excellent heat transport characteristics with a favorable maximum heat transport amount and low thermal resistance even when the heat pipe is thin.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a heat pipe having a heat receiving portion that is configured to be thermally connected to a heat generating member so as to absorb heat from the heat generating member, the heat pipe including: a flat container having a tube shape of which both ends are sealed, the flat container having a pair of flat inner surfaces that oppose each other in a vertical direction in cross sections perpendicular to a lengthwise direction of the flat container; a wick structure housed inside the flat container; and a working fluid sealed inside the flat container, wherein in at least one cross section of the flat container, the wick structure contacts both of the pair of flat inner surfaces of the flat container, and both side faces of the wick structure do not contact any of the inner surfaces of the flat container, wherein the wick structure has a first wick part and a second wick part, respectively disposed in the lengthwise direction of the flat container, the second wick part being directly or indirectly connected to the first wick part and having a maximum width that is wider than a maximum width of the first wick part, and wherein the second wick part is disposed in the heat receiving portion of the heat pipe.

In an aspect of the heat pipe of the present invention, the maximum width of the first wick part is 45% to 65% of a maximum width of an inner space of the flat container, and the maximum width of the second wick part is 65% to 95% of the maximum width of the inner space of the flat container.

In the aforementioned aspect, a maximum width of the first wick part is 45% to 65% relative to the width in the direction (cross section of the flat container) orthogonal to the lengthwise direction inside the flat container; thus, on the pair of flat inner surfaces of the flat container corresponding to the position of the first wick part, there is a location that does not contact the wick structure, and this location is exposed to the inner space of the flat container. Moreover, a maximum width of the second wick part is 65% to 95% relative to the width in the direction (cross section of the flat container) orthogonal to the lengthwise direction inside the flat container; thus, on the pair of flat inner surfaces of the flat container corresponding to the position of the second wick part, there is a location that does not contact the wick structure, and this location is exposed to the inner space of the flat container. Furthermore, the exposed region of the flat inner surfaces of the flat container corresponding to the position of the first wick part is wider than the exposed region of the flat inner surfaces of the flat container corresponding to the position of the second wick part.

In an aspect of the heat pipe of the present invention, a length of the second wick part in the lengthwise direction of the flat container is 2% to 50% of a sum of a length of the first wick part in the lengthwise direction of the flat container and a length of the second wick part in the lengthwise direction of the flat container.

In an aspect of the heat pipe of the present invention, in the least one cross section: a cross section of the wick structure has a flat bottom and a convex-shaped top, the convex-shaped top of the wick structure contacts one inner surface of the pair of flat inner surfaces, and the bottom contacts another inner surface of the pair of inner surfaces.

In the aforementioned aspect, among the pair of flat inner surfaces opposing each other in the flat container, the convex-shaped top of the wick structure opposing the one inner surface contacts the one inner surface; thus, the one inner surface of the flat container is exposed to the inner space of the flat container, except for the locations contacting the convex-shaped top of the wick structure.

In an aspect of the heat pipe of the present invention, the second wick part of the wick structure is in the at least one cross section, and in the at least one cross section, a maximum width of the bottom of the second wick part is 65% to 95% of a maximum width of an inner space of the flat container.

In an aspect of the heat pipe of the present invention, the first wick part is disposed on one end in the lengthwise direction of the flat container, and the second wick part is disposed on the other end in the lengthwise direction of the flat container.

In an aspect of the heat pipe of the present invention, there are two first wick parts, and one of the first wick parts is disposed on one end in the lengthwise direction of the flat container, and the other of the first wick parts is disposed on the other end in the lengthwise direction of the flat container, the second wick part being disposed in a center in the lengthwise direction of the flat container.

In an aspect of the present invention, the heat pipe further includes a third wick part disposed between the first wick part and the second wick part in the lengthwise direction of the flat container, the third wick part having a maximum width that is wider than the maximum width of the first wick part and narrower than the maximum width of the second wick part.

In an aspect of the heat pipe of the present invention, in the at least one cross section, the side faces of the wick structure that do not contact any of the inner surfaces of the flat container have a convex shape.

In an aspect of the heat pipe of the present invention, the first wick part and the second wick part are sintered metal compacts.

In an aspect of the heat pipe of the present invention, the sintered metal compact of the second wick part is formed of sintered powders having a finer particle size than sintered powders of the sintered metal compact of the first wick part.

In an aspect of the heat pipe of the present invention, the pair of flat inner surfaces opposing each other are vertically separated by a distance of 1.5 mm or less.

In the aforementioned aspect, the flat container has a pair of flat inner surfaces that oppose each other (i.e., one inner surface and the other inner surface that opposes the one inner surface), and the distance between the opposing flat inner faces is 1.5 mm or less.

In an aspect of the heat pipe of the present invention, in every cross section of the wick structure, the wick structure contacts both of the pair of flat inner surfaces of the flat container, and both side faces of the wick structure do not contact any of the inner surfaces of the flat container.

In an aspect of the present invention, the heat pipe further includes a thermally conductive member attached to the heat receiving portion of the heat pipe so as to be thermally connected to the heat generating member.

In an aspect of the heat pipe of the present invention, in a cross section of the heat receiving portion of the heat pipe that is different from the at least one cross section, the wick structure contacts only one of the pair of flat inner surfaces of the flat container, and both side faces of the wick structure do not contact any of the inner surfaces of the flat container.

According to an aspect of the present invention, when a heat pipe has a first wick part and a second wick part that has a wider maximum width than the first wick part, and a location of the heat pipe contacting a heat generating member is regarded as a heat receiving portion, the positioning of the second wick part at the heat receiving portion makes it possible to obtain, even if the heat pipe is thin, excellent heat transport characteristics with an excellent maximum heat transport amount and reduced thermal resistance.

According to an aspect of the present invention, the heat pipe has the first wick part and the second wick part that is formed as the heat receiving portion, wherein the first wick part has a maximum width of 45% to 65% relative to the maximum width of a cross section of a flat container, and the second wick part has a maximum width that is wider than the first wick part and 65% to 95% relative to the maximum width of the cross section of the flat container; thus, even if the heat pipe is thin, it is possible to obtain even better heat transport characteristics with reduced thermal resistance and an excellent maximum heat transport amount.

According to an aspect of the present invention, the length of the second wick part in the lengthwise direction of the flat container is 2% to 50% of the sum of the length of the first wick part and the length of the second wick part in the lengthwise direction of the flat container, thus making it possible to further reduce thermal resistance while improving the maximum heat transport amount.

According to an aspect of the present invention, it is possible to reduce thermal resistance while further improving the maximum heat transport amount due to the cross section of the wick structure having the convex-shaped top side part and bottom side part, and due to the maximum width of the bottom side part of the second wick part being 65% to 95% of the maximum width of the cross section of the flat container.

It is to be understood that both the foregoing general description and the following detailed description are exemplary and explanatory, and are intended to provide further explanation of the invention as claimed.

DETAILED DESCRIPTION OF EMBODIMENTS

A heat pipe according to Embodiment 1 of the present invention will be described below with reference to the drawings.

Figure 1A:
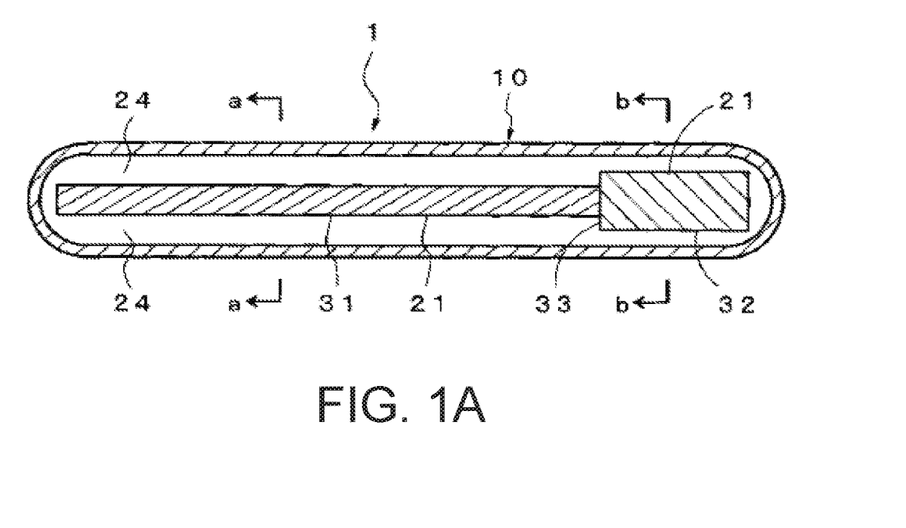
FIG. 1A is a planar cross-sectional view of a heat pipe according to Embodiment 1 of the present invention.
Figure 1B:
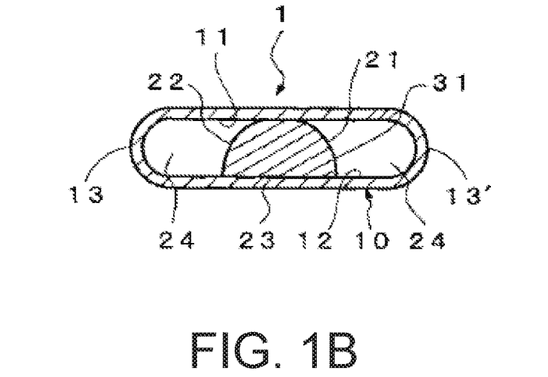
FIG. 1B is a cross-sectional view along a-a in FIG. 1A.
Figure 1C:
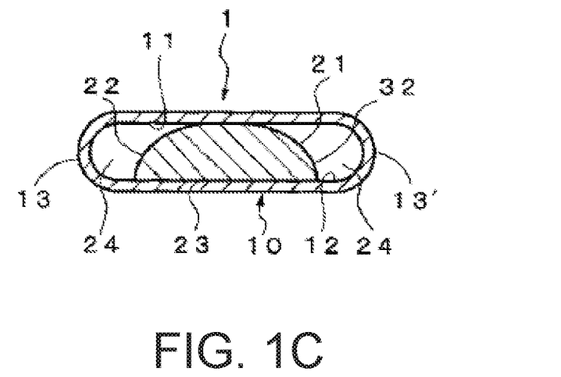
FIG. 1C is a cross-sectional view along b-b in FIG. 1A.

As shown in FIGS. 1A to 1C, a heat pipe 1 according to Embodiment 1 includes a tube shaped flat container 10 having one flat inner surface 11 and another flat inner surface 12 opposing the one flat inner surface 11, a wick structure 21 disposed on the other flat inner surface 12, and a working fluid (not shown) sealed inside the flat container 10.

As shown in FIGS. 1B and 1C, the flat container 10 is a sealed straight tube member that has the one flat inner surface 11 and the other flat inner surface 12 opposing the one flat inner surface 11, and curved sections 13 and 13' formed between the one flat inner surface 11 and the other flat inner surface 12. The cross-sectional shape of the flat container in a direction orthogonal to the lengthwise direction (i.e., the cross-sectional shape perpendicular to the lengthwise direction) is a flat shape. In other words, the flat container 10 has a pair of flat inner surfaces that oppose each other in the vertical direction in a cross section perpendicular to the lengthwise direction. The entirety of the flat container 10 in the lengthwise direction thereof is a flat shape. Furthermore, the cross-sectional area of the inner space of the flat container 10 in the direction orthogonal to the lengthwise direction is the same at all locations, and the one flat inner surface 11 is formed in a direction parallel to the other flat inner surface 12. Moreover, the distance between the one flat inner surface 11 and the other flat inner surface 12 is not particularly limited, but is 1.5 mm or less in the flat container 10, or in particular, a thin shape of 1.0 mm or less. The heat transport direction of the heat pipe 1 is the lengthwise direction of the flat container 10.

The wick structure 21 has a curved section 22, which is a convex-shaped top side part of a convex shape protruding from the other flat inner surface 12, and a flat bottom side part 23, which contacts part of the other flat inner surface 12. In the heat pipe 1, the bottom side part 23 is adhered to the other flat inner surface 12. The wick structure 21 is disposed in the center in the direction (cross section of flat container 10) orthogonal to the lengthwise direction of the flat container 10. In the heat pipe 1, the cross-sectional shape of the wick structure 21 in the direction orthogonal to the lengthwise direction of the flat container 10 is a semi-elliptical shape.

In the heat pipe 1, the region of the other flat inner surface 12 of the flat container 10 not contacting the bottom side part 23 of the wick structure 21, and the region of the one flat inner surface 11 of the flat container 10 not contacting the curved section 22 of the wick structure 21, and the curved sections 13 and 13' of the flat container 10, are all exposed to the inner space of the flat container 10.

The curved section 22 of the wick structure 21 contacts the one flat inner surface 11 of the flat container 10. In the heat pipe 1, the top of the curved section 22 contacts the one flat inner surface 11. The top of the curved section 22 pressure contacts the one flat inner surface 11. Accordingly, the top of the curved section 22 is compressed and deformed. This can further improve the capillary pressure of the wick structure 21 and cause the working fluid in the liquid phase to circulate more smoothly.

As shown in FIG. 1B, a first wick part 31, which is formed of the wick structure 21, is formed at one end of the flat container 10. The maximum width of the bottom side part 23 in the first wick part 31 in the direction orthogonal to the lengthwise direction of the flat container 10 is 45% to 65% of the maximum width of the inner space of the flat container 10 in the direction orthogonal to the lengthwise direction of the flat container. The first wick part 31 of the heat pipe 1 has a cross-sectional shape in the direction orthogonal to the lengthwise direction of the flat container 10 that has approximately the same shape and dimensions at all locations in the lengthwise direction of the flat container 10. Accordingly, in the first wick part 31, the width of the bottom side part 23 is approximately uniform in the lengthwise direction of the flat container 10.

In contrast, as shown in FIG. 1C, a second wick part 32, which is formed of the wick structure 21, is formed at the other end of the flat container 10. Accordingly, the wick structure 21 has a first wick part 31 and a second wick part 32. The maximum width of the bottom side part 23 in the second wick part 32 in the direction orthogonal to the lengthwise direction of the flat container 10 is 65% to 95% of the maximum width of the inner space of the flat container 10 in the direction orthogonal to the lengthwise direction of the flat container. Moreover, the width (in the direction orthogonal to the lengthwise direction of the flat container) of the bottom side part 23 of the second wick part 32 is always wider than the width (in the direction orthogonal to the lengthwise direction of the flat container) of the bottom side part 23 of the first wick part 31. The second wick part 32 of the heat pipe 1 has a cross-sectional shape in the direction orthogonal to the lengthwise direction of the flat container 10 that has approximately the same shape and dimensions at all locations in the lengthwise direction of the flat container 10. Accordingly, as above, in the second wick part 32, the width of the bottom side part 23 is approximately uniform in the lengthwise direction of the flat container 10.

As shown in FIG. 1A, in the heat pipe 1, the first wick part 31 is formed at a location between one end and the other end of the flat container 10, or namely, is formed in the center of the flat container 10 in a similar manner to the one end of the flat container 10.

In the heat pipe 1, a portion of the flat container 10 that has the second wick part 32 is a heat receiving portion of the heat pipe 1, and a portion of the flat container 10 that has the first wick part 31 is a heat dissipating part of the heat pipe 1. In order to function as a heat receiving portion, a heat generating member (not shown) is thermally connected to a prescribed location of the flat container 10. When thermally connecting the heat generating member to the prescribed location of the flat container 10, a thermally conductive member such as a metal heat receiving plate, thermally conductive rubber, or thermal rubber may be provided between the prescribed location and the heat generating member as necessary. Furthermore, in order to function as a heat dissipating part, a heat exchange member (not shown) such as heat radiating fins or heat sink, for example, is thermally connected to a prescribed location of the flat container 10.

In the heat pipe 1, the width of the second wick part 32 in the direction orthogonal to the lengthwise direction of the flat container is greater than the width of the first wick part 31 in the direction orthogonal to the lengthwise direction of the flat container. The width of the second wick part 32 in the direction orthogonal to the lengthwise direction of the flat container is 65% to 95% relative to the width of the flat container 10 in the direction orthogonal to the lengthwise direction of the flat container, and the width of the first wick part 31 is 45% to 65% relative to the width of the flat container 10 in the direction orthogonal to the lengthwise direction of the flat container. This makes it possible to achieve excellent heat transport characteristics with reduced thermal resistance and an excellent maximum heat transport amount, even if the container is thin.

As shown in FIG. 1A, in the heat pipe 1, the wick structure 21 extends in a straight line in a direction from one end to the other end of the flat container 10, or namely, in the direction parallel to the lengthwise direction of the flat container 10. For the wick structure 21, the width of the second wick part 32 in the direction orthogonal to the lengthwise direction of the flat container 10 is wider than the width of the first wick part 31, and a step 33 is formed at the boundary between the first wick part 31 and the second wick part 32. The boundary between the first wick part 31 and the second wick part 32 need not be a step, and the width may gradually change instead.

The length of the second wick part 32 in the lengthwise direction of the flat container 10 has no particular limitations, but is preferably 2% to 50% of the sum of the length of the first wick part 31 and the length of the second wick part 32 in the lengthwise direction of the flat container 10, so as to have a favorable balance between the increase in maximum heat transport amount and decrease in thermal resistance. Furthermore, the length in the lengthwise direction of the flat container 10 of the bottom side part 23 of the second wick part 32 has no particular limitations, but is preferably 1.0 to 5.0 times and particularly 1.5 to 3.0 times the length of the heat generating member thermally connected to the heat receiving portion, so as to have a favorable balance between the increase in maximum heat transport amount and decrease in thermal resistance. Moreover, the width of the bottom side part 23 of the second wick part 32 in the direction orthogonal to the lengthwise direction of the flat container 10 has no particular limitations, but is preferably 0.50 to 1.5 times and particularly 0.70 to 1.3 times the width of the heat generating member thermally connected to the heat receiving portion, so as to have a favorable balance between the increase in maximum heat transport amount and decrease in thermal resistance.

As shown in FIGS. 1A to 1C, the locations in the inner space of the flat container 10 where the wick structure 21 is not disposed functions as a steam flow path 24 for the working fluid in the gas phase. In other words, the steam flow path 24 is formed of the region of the one flat inner surface 11 not contacting the wick structure 21, the surface of the curved section 22, the region of the other flat inner surface 12 not contacting the wick structure 21, and the curved sections 13 and 13' of the flat container 10. Accordingly, the steam flow path 24 extends in a straight line in the direction parallel to the lengthwise direction of the flat container 10, and the steam flow path 24 on the first wick part 31 side is wider than the steam flow path 24 on the second wick part 32, with the step 33 as the boundary. The steam flow path 24 is provided on both sides of the wick structure 21.

The material of the flat container 10 has no particular limitations, and can be copper, to have excellent thermal conductivity; aluminum, to be lightweight; stainless steel, to improve strength; or the like. The material of the wick structure 21 has no particular limitations, and can be a metal powder such as copper powder or stainless steel powder, carbon powder, a mixed powder of copper powder and carbon powder, nanoparticles of the aforementioned powders, a sintered compact such as a composite alloy in which a metal mesh and metal powder have been combined, or the like. The sintered compact can be manufactured by sintering the aforementioned powders or composite metal to bond the powder, and forming a porous structure having capillary pressure by sintering. It is preferable that the sintered metal compact of the second wick part 32 be formed of a sintered powder having a finer particle size than the sintered metal compact of the first wick part 31, in order to improve the capillary force of the second wick part 32 over the capillary force of the first wick part 31 and to smoothly circulate the working fluid in the liquid phase to the heat receiving portion.

The working fluid sealed in the flat container 10 can be selected as appropriate based on compatibility with the material of the flat container 10, and examples of the working fluid include water, alternative chlorofluorocarbon, perfluorocarbon, or cyclopentane.

Next, the heat transport mechanism of the heat pipe 1 according to Embodiment 1 of the present invention will be explained. When the heat pipe 1 receives heat from the heat generating member thermally connected at the heat receiving portion, the working fluid changes phases from a liquid phase to a gas phase at the heat receiving portion. The gas phase working fluid flows through the steam flow path 24 from the heat receiving portion to the heat dissipating part in the lengthwise direction of the flat container 10, thereby transporting the heat from the heat generating member to the heat dissipating part from the heat receiving portion. The heat from the heat generating part that has been transported from the heat receiving portion to the heat dissipating part changes phases from a gas phase working fluid to a liquid phase working fluid at the heat dissipating part provided with the heat exchange member, thus being discharged as latent heat. The latent heat discharged at the heat dissipating part is discharged from the heat dissipating part to the external environment of the heat pipe 1 via the heat exchange member provided to the heat dissipating part. The working fluid that has changed phases to a liquid phase at the heat dissipating part is taken in by the wick structure 21 and is returned from the heat dissipating part to the heat receiving portion by the capillary pressure of the wick structure 21.

Next, a heat pipe according to Embodiment 2 of the present invention will be described below with reference to the drawings. The same reference characters are used for the same components as the heat pipe of Embodiment 1.

Figure 2A:
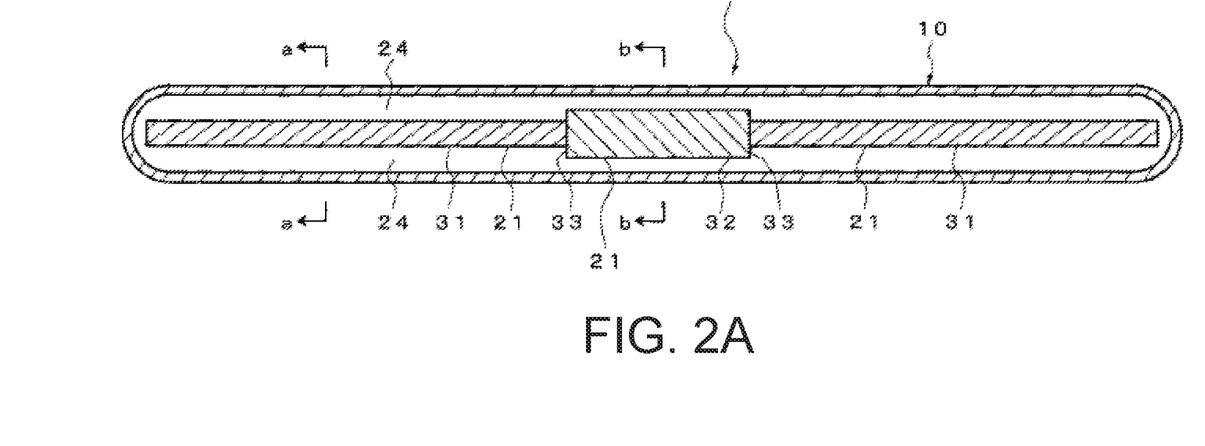
FIG. 2A is a planar cross-sectional view of a heat pipe according to Embodiment 2 of the present invention.
Figure 2B:
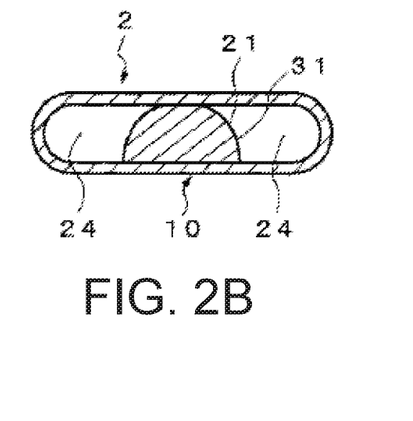
FIG. 2B is a cross-sectional view along a-a in FIG. 2A.
Figure 2C:
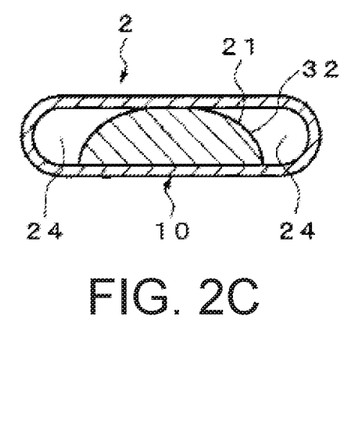
FIG. 2C is a cross-sectional view along b-b in FIG. 2A.

In the heat pipe 1, the first wick part 31 was disposed at one end and the center in the lengthwise direction of the flat container 10, and the second wick part 32 was disposed at the other end. Instead of this configuration, in the heat pipe 2 of Embodiment 2, as shown in FIGS. 2A to 2C, a second wick part 32 is disposed in the center in the lengthwise direction of the flat container 10, and first wick parts 31 are respectively disposed at both ends in the lengthwise direction of the flat container 10. In other words, there are two first wick parts 31. Accordingly, in the heat pipe 2, the center in the lengthwise direction of the flat container 10 is the heat receiving portion, and the one end and other end in the lengthwise direction of the flat container 10 are heat dissipating parts. The first wick parts 31 are provided on both ends of the second wick part 32; thus, there are two boundaries between the first wick parts 31 and second wick part 32, and thus there are two steps 33 formed.

The heat pipe 2 also makes it possible to achieve excellent heat transport characteristics with reduced thermal resistance and an excellent maximum heat transport amount. Furthermore, in the heat pipe 2, a plurality (two in the drawings) of heat dissipating parts can be provided, which further improves the cooling efficiency of the heat generating member.

Next, a heat pipe according to Embodiment 3 of the present invention will be described below with reference to the drawings. The same reference characters are used for the same components as the heat pipes of Embodiments 1 and 2.

Figure 3:
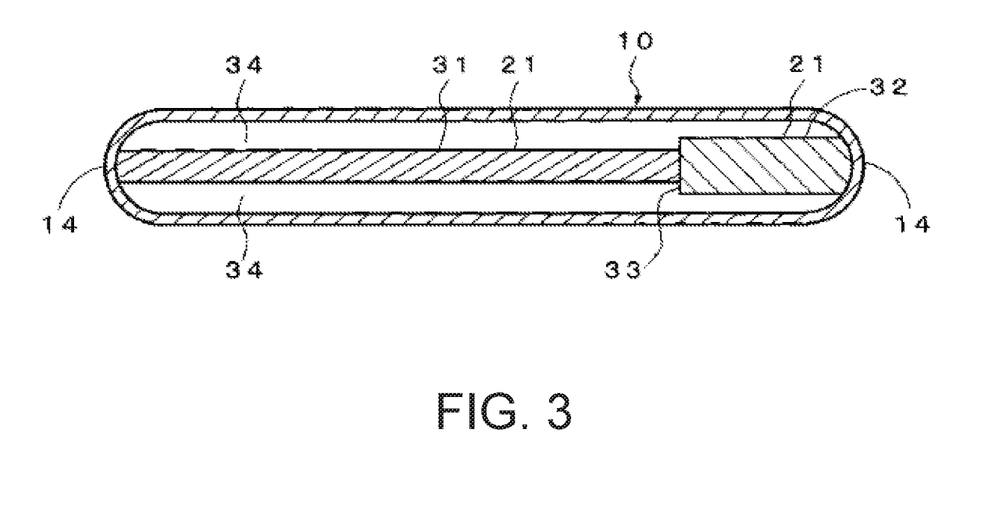
FIG. 3 is a planar cross-sectional view of a heat pipe according to Embodiment 3 of the present invention.

In the heat pipe 1 according to Embodiment 1, the wick structure 21 was not provided at both end faces in the lengthwise direction of the flat container 10, but rather the entirety of both end faces was exposed to the inner space of the flat container 10; however, instead of this configuration, in the heat pipe 3 of Embodiment 3, as shown in FIG. 3, a wick structure 21 extends up to both end faces 14 in the lengthwise direction of the flat container 10. Accordingly, both end faces of the wick structure 21 in the lengthwise direction of the flat container 10 contact both end faces 14 in the lengthwise direction of the flat container 10.

The heat pipe 3 also makes it possible to achieve excellent heat transport characteristics with reduced thermal resistance and an excellent maximum heat transport amount.

Next, a heat pipe according to Embodiment 4 of the present invention will be described below with reference to the drawings. The same reference characters are used for the same components as the heat pipes of Embodiments 1 to 3.

Figure 4:
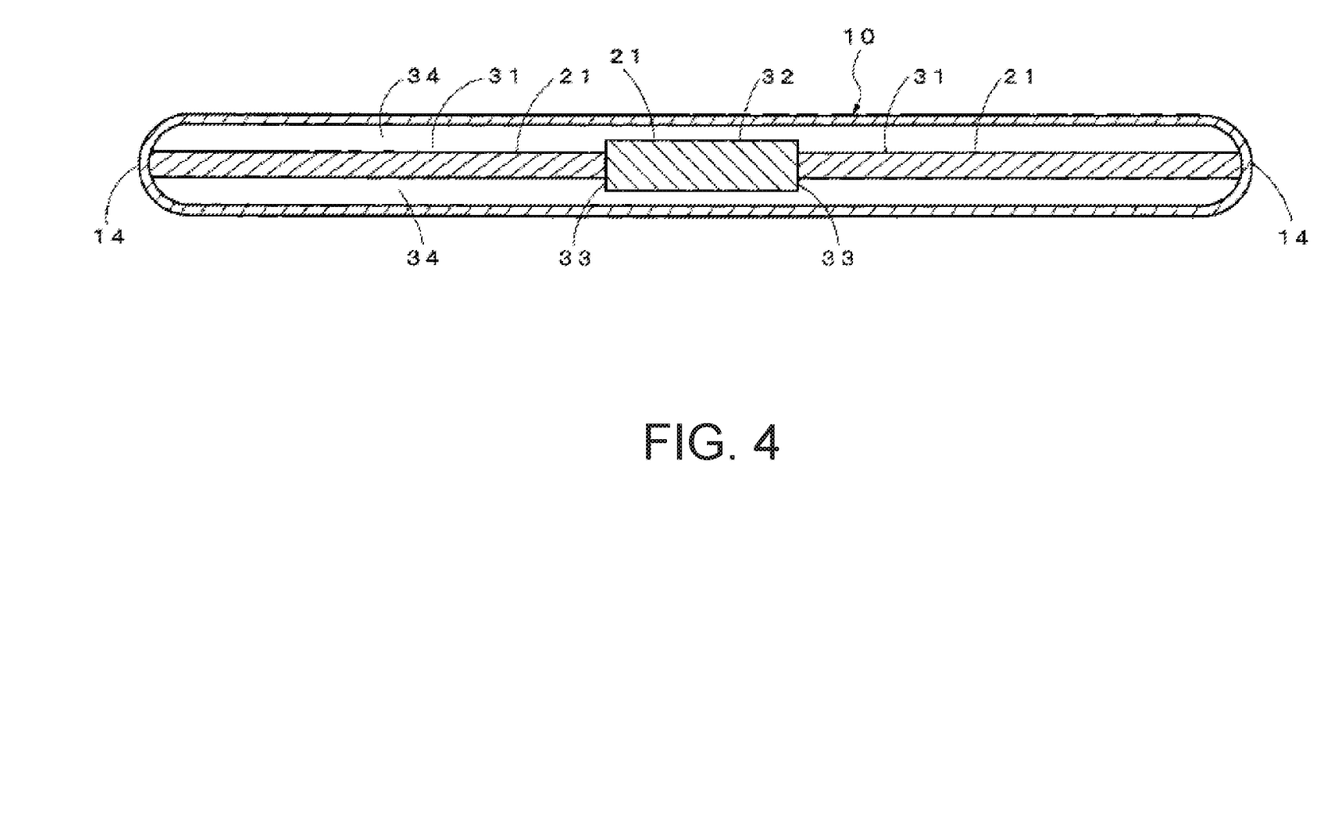
FIG. 4 is a planar cross-sectional view of a heat pipe according to Embodiment 4 of the present invention.

In the heat pipe 2 according to Embodiment 2, the wick structure 21 was not provided at both end faces in the lengthwise direction of the flat container 10, but rather the entirety of both end faces was exposed to the inner space of the flat container 10; however, instead of this configuration, in the heat pipe 4 of Embodiment 4, as shown in FIG. 4, a wick structure 21 extends up to both end faces 14 in the lengthwise direction of the flat container 10. Accordingly, both end faces of the wick structure 21 in the lengthwise direction of the flat container 10 contact both end faces 14 in the lengthwise direction of the flat container 10.

The heat pipe 4 also makes it possible to achieve excellent heat transport characteristics with reduced thermal resistance and an excellent maximum heat transport amount.

Next, an example of a method of manufacturing the heat pipe of the present invention will be described. The method of manufacturing has no particular limitations; however, as an example, for the heat pipe according to Embodiment 1, a core rod having a cutout of a prescribed shape is inserted along the lengthwise direction of a round tube member, and a metal material in powdered form, which will become the wick structure, is filled into a cavity between the inner wall faces of the tube member and the outer faces of the cutout. The cutout of the core rod has a small cutout corresponding to the position of the first wick part and a large cutout corresponding to the position of the second wick part. Next, a thermal treatment is applied to form a precursor of the wick structure. Thereafter, the core rod is removed from the small cutout side and the tube member is flattened to manufacture a heat pipe having the wick structure.

The heat pipe according to Embodiment 2 can be manufactured in a similar manner to the heat pipe according to Embodiment 1, but instead of the core rod used in the heat pipe of Embodiment 1, a first core rod having a small cutout corresponding to the position of the first wick part and a large cutout corresponding to the position of the second wick part is inserted from one end of the round tube member up to the center in the lengthwise direction, and a second rod part having a small cutout corresponding to the position of the first wick part is inserted from the other end of the round tube member. After the filling of the powdered metal material and heat treatment, the first core rod is removed from the small cutout side at the one end side of the tube member, and the second core rod is removed from the other end side, thus making it possible to manufacture the heat pipe of Embodiment 2.

Next, other embodiments of the present invention will be explained. In the heat pipes of the respective embodiments above, a second wick part having a wide width in the direction orthogonal to the lengthwise direction of the flat container was disposed adjacent to a first wick part for which the width is narrow, but instead of this configuration, a third wick part for which the width is wider than the first wick part and narrower than the second wick part may be provided between the first wick part and the second wick part. The width of the third wick part may be uniform, or may gradually expand from the first wick part to the second wick part.

In the heat pipe of Embodiment 1, the first wick part for which the width is narrow was formed in the center of the flat container in a similar manner to the one end of the flat container, but instead of this configuration, a second wick part for which the width is wide may be formed in a similar manner to the other end of the flat container. In the heat pipes of the respective embodiments above, the first wick part and the second wick part each had, in the lengthwise direction of the flat container, a width of the bottom side part in the direction orthogonal to the lengthwise direction of the flat container that was approximately uniform, but instead of this configuration, the width need not necessarily be approximately uniform, and may gradually widen, or may repeatedly widen and contract, or the like, for example, as long as the width is within the numerical ranges described above.

In the heat pipes of the respective embodiments above, the entirety of the container in the lengthwise direction was a flat shape, but instead of this configuration, a part in the lengthwise direction may be a flat shape.

In the heat pipes of the respective embodiments above, the cross-sectional shape of the wick structure was a semi-elliptical shape, but the shape has no particular limitations and may be rectangular, for example. In the heat pipes of the respective embodiments above, the wick structure was provided in the center in the direction orthogonal to the lengthwise direction of the flat container, but the position of the wick structure has no particular limitations, and may be outside the center (at the end, for example). In the heat pipes of the respective embodiments above, the top of the convex-shaped top side part pressure contacted the flat inner surface of the container, but instead of this configuration, the part may contact the container without pressure.

In the heat pipes of the respective embodiments above, the top of the convex-shaped top side part pressure contact the flat inner surface of the container, but instead of this configuration, a configuration is possible in which the top of the convex-shaped top side part of the first wick part contacts the container, and the top of the convex-shaped top side part of the second wick part does not contact the container, or a configuration in which the top of the convex-shaped top side part of the second wick part, which requires high capillary pressure, contacts the container, and the top of the convex-shaped top side part of the first wick part does not contact the container.

Figure 5A:
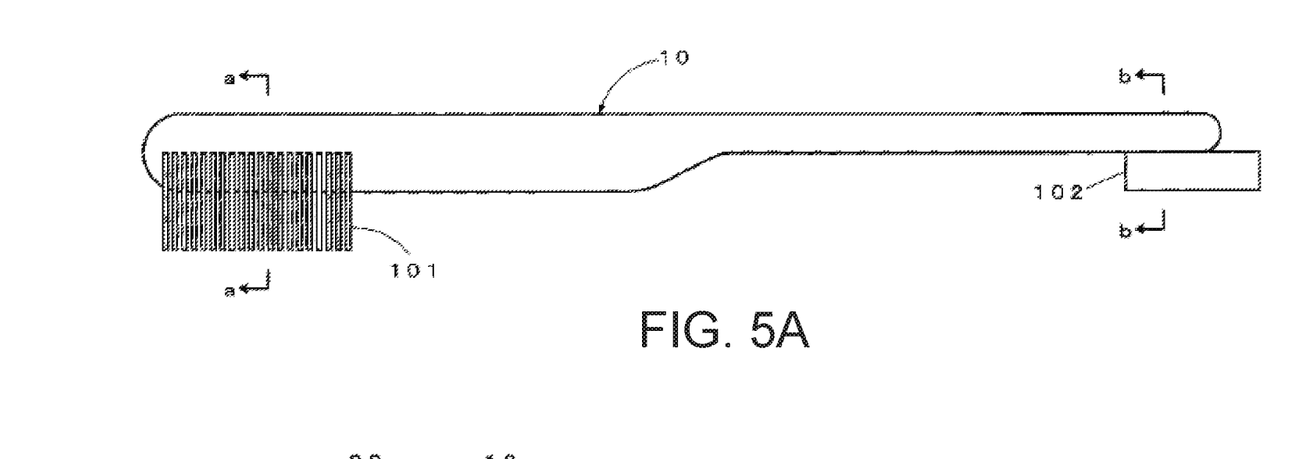
FIG. 5A is a side view of a heat pipe according to another embodiment of the present invention.
Figure 5B:
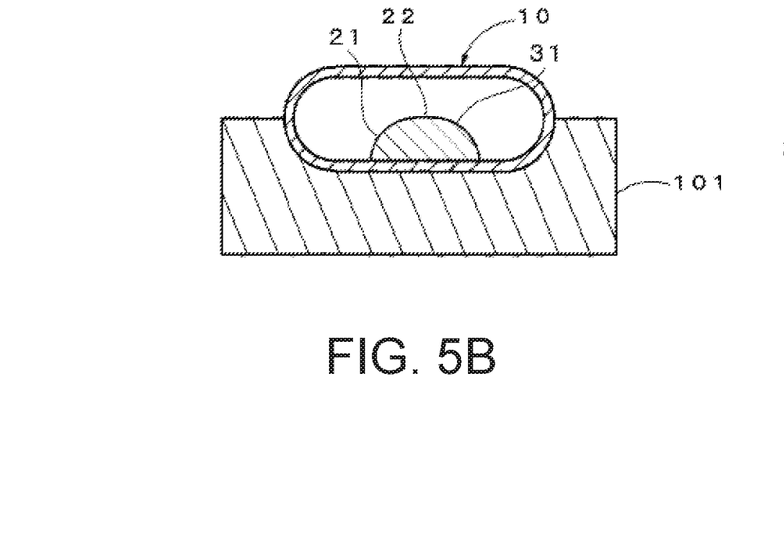
FIG. 5B is a cross-sectional view along a-a in FIG. 5A.
Figure 5C:
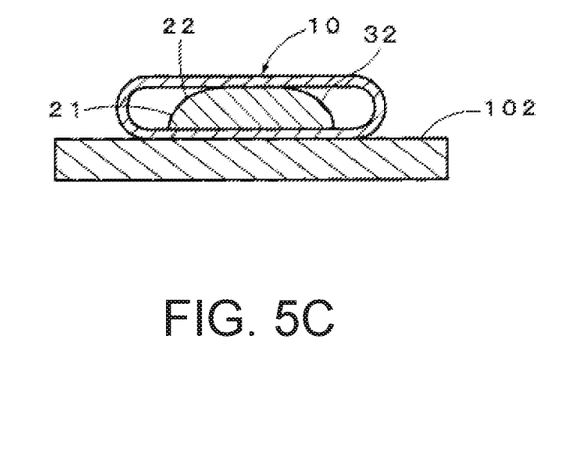
FIG. 5C is a cross-sectional view along b-b in FIG. 5A.

In such a case, as shown in FIGS. 5A to 5C, for example, a configuration is possible in which the thickness of the flat container 10 changes at the center in the lengthwise direction of the flat container 10: at the thicker end of the flat container 10 (as shown in FIG. 5B, the end to which heat radiating fins 101 are thermally connected), the curved section 22 of the first wick part 31 of the wick structure 21 does not contact the flat container 10, but rather, at the thinner end of the flat container 10 (as shown in FIG. 5C, the end to which a heat generating member 102 is thermally connected), the curved section 22 of the second wick part 32 of the wick structure 21 contacts the flat container 10.

Figure 6A:
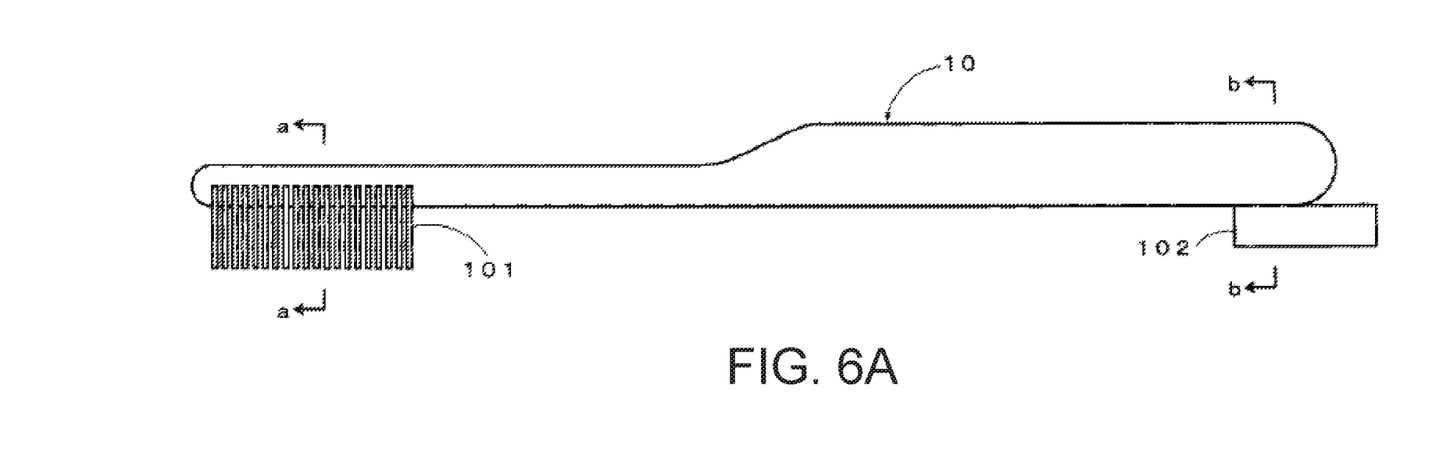
FIG. 6A is a side view of a heat pipe according to another embodiment of the present invention.
Figures 6B, 6C:
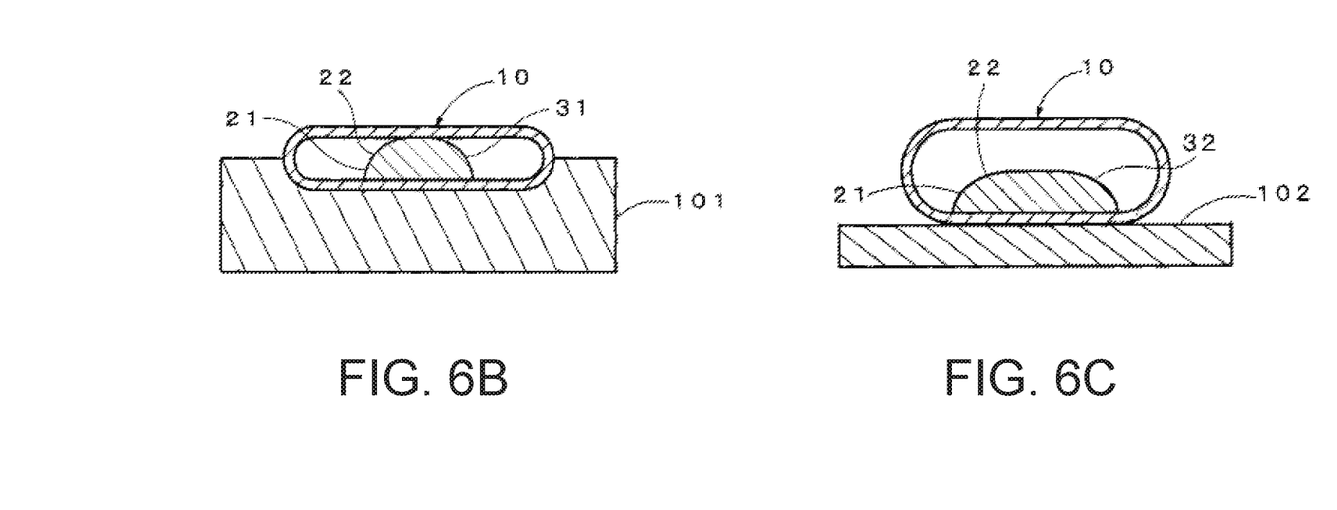
FIG. 6B is a cross-sectional view along a-a in FIG. 6A.
FIG. 6C is a cross-sectional view along b-b in FIG. 6A.

Moreover, as shown in FIGS. 6A to 6C, a configuration is possible in which the thickness of the flat container 10 changes at the center in the lengthwise direction of the flat container 10: at the thicker end of the flat container 10 (as shown in FIG. 6C, the end to which a heat generating member 102 is thermally connected), the curved section 22 of the second wick part 32 of the wick structure 21 does not contact the flat container 10, but rather, at the thinner end of the flat container 10 (as shown in FIG. 6B, the end to which heat radiating fins 101 are thermally connected), the curved section 22 of the first wick part 31 of the wick structure 21 contacts the flat container 10.

In the heat pipes of the respective embodiments above, the flat container is a tube member, and the cross-sectional shape thereof is a substantially elliptical shape having a pair of flat inner surfaces that vertically oppose each other, but there are no particular limitations on the cross-sectional shape of the flat container, and the shape may be a rectangle with corners, for example.

Figure 7:
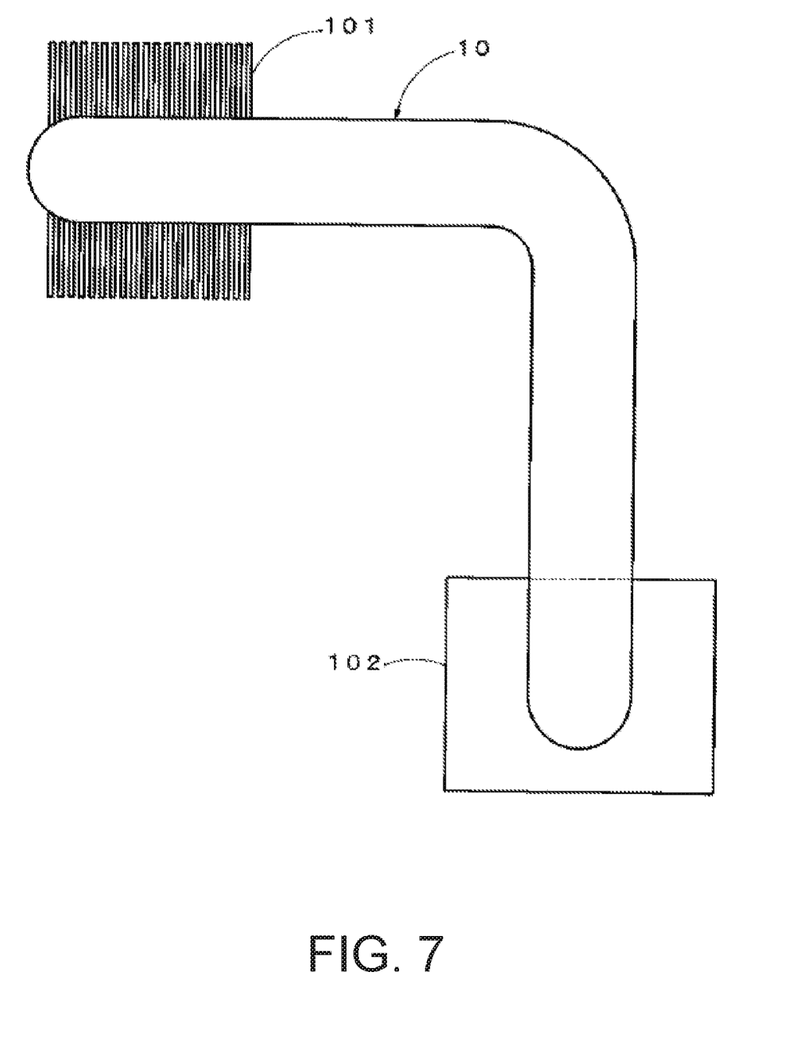
FIG. 7 is a diagram for explaining a heat pipe according to another embodiment of the present invention.

Furthermore, in the heat pipes of the respective embodiments above, the tube member flat container was a straight shape, but there are no particular limitations on the shape in the lengthwise direction shape of the tube member; as shown in FIG. 7, for example, the tube container 10 may be bent into an L-shape or the like, and a heat exchange member such as the heat radiating fins 101 may be thermally connected to one end, and a heat generating member 102 may be thermally connected to the other end.

Figure 8A:
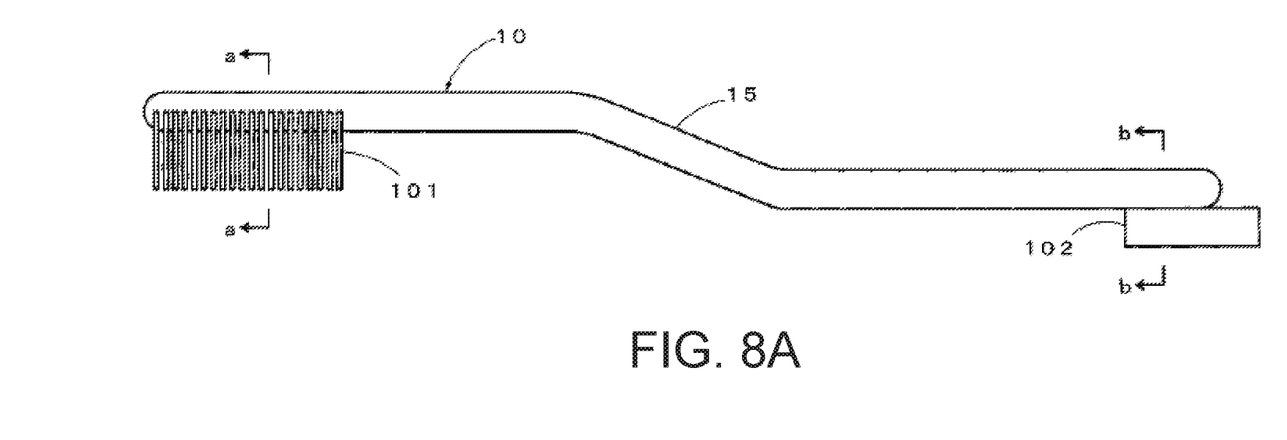
FIG. 8A is a side view of a heat pipe according to another embodiment of the present invention.
Figure 8B:
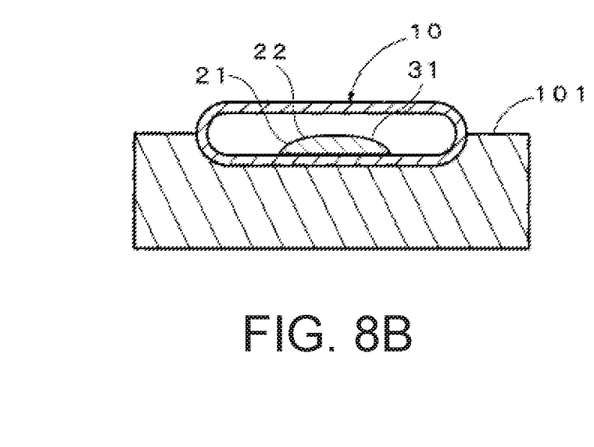
FIG. 8B is a cross-sectional view along a-a in FIG. 8A.
Figure 8C:
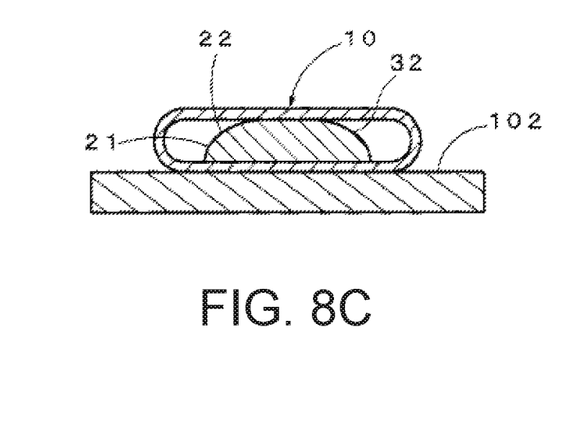
FIG. 8C is a cross-sectional view along b-b in FIG. 8A.
Figure 9A:
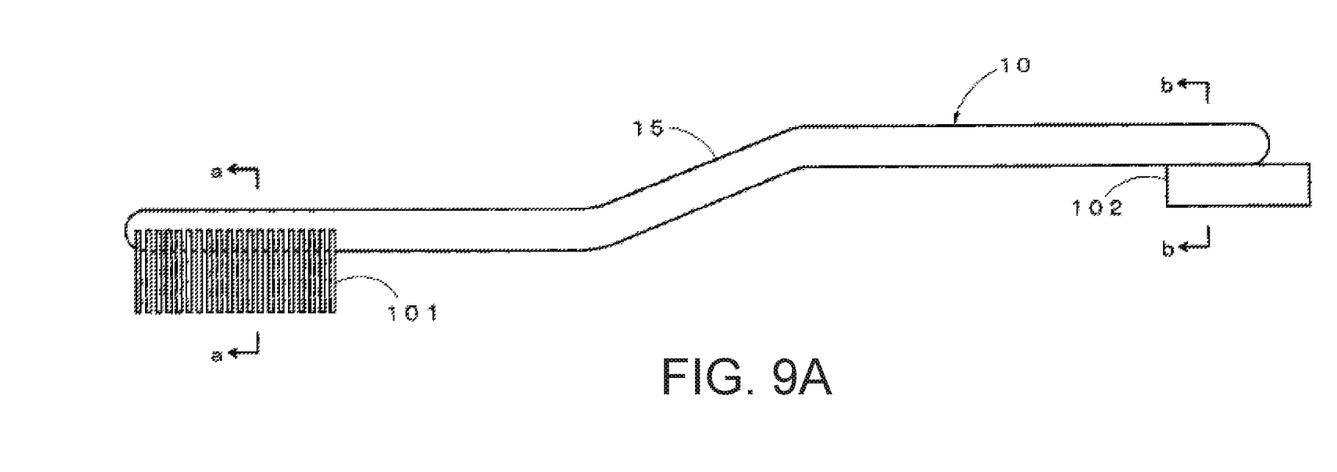
FIG. 9A is a side view of a heat pipe according to another embodiment of the present invention.
Figure 9B:
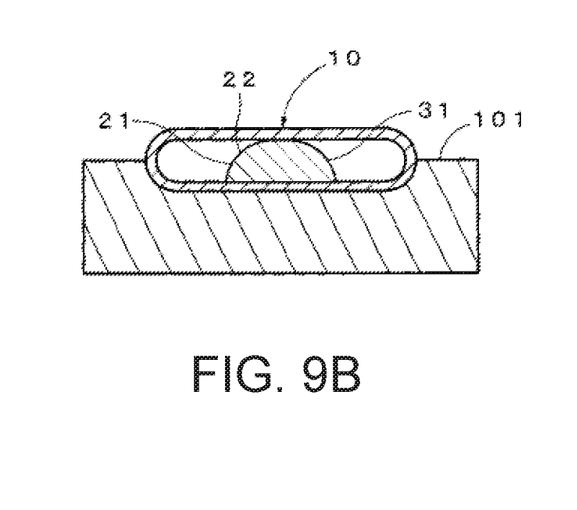
FIG. 9B is a cross-sectional view along a-a in FIG. 9A.
Figure 9C:
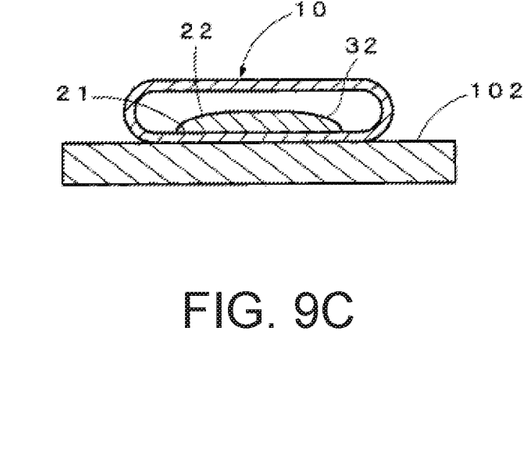
FIG. 9C is a cross-sectional view along b-b in FIG. 9A.

In addition, as shown in FIG. 8 and FIG. 9, the shape of the flat container 10, which has a uniform thickness, may have a step-like location 15 in the center in the lengthwise direction of the flat container 10. In such a case, at the end of the flat container 10 to which the heat generating member 102 is thermally connected, the curved section 22 of the second wick part 32 may contact the flat container 10, as shown in FIG. 8C, or may not contact the flat container 10, as shown in FIG. 9C. In a similar manner, at the end of the flat container 10 to which the heat exchange member such as the heat radiating fins 101 is thermally connected, the curved section 22 of the first wick part 31 may not contact the flat container 10, as shown in FIG. 8B, or may contact the flat container 10, as shown in FIG. 9B.

In the heat pipes of Embodiments 1 and 2, the distance between one flat inner surface of the flat container and the other flat inner surface, or namely, the thickness of the flat container, was uniform, but instead of this configuration, the distance need not be uniform; for example, the thickness of the flat container corresponding to the position of the first wick part may differ from the thickness of the flat container corresponding to the position of the second wick part (e.g., the thickness of the flat container corresponding to the position of the second wick part may be thinner than the thickness of the flat container corresponding to the position of the first wick part).

In the heat pipe of Embodiment 2, one second wick part was disposed in the center, but there are no particular limitations to the number of second wick parts, and a plurality may be provided instead. In such a case, the first wick part and/or third wick part would be disposed between the adjacent second wick parts.

Working Example

Next, a working example of the present invention will be described, but the present invention is not limited to this example.

As a working example, a configuration having the same structure as the heat pipe of Embodiment 1 was used. However, the maximum widths of the first wick part and second wick part were modified as indicated in Table 1 below. For the container, a tube member with a length of 200 mm and φ of 8 mm was flattened to 1 mm. A 10 mm×20 mm and 15 W member was used as the heat generating member. The heat generating member was made to contact the other end of the container (heat pipe) where the second wick part was formed, a thermocouple was installed at a location of 15 mm from the one end of the container (heat pipe) where the first wick part was formed, and ΔT was measured.

ΔT was evaluated as "A" when 0° C. to 5° C., "B" when exceeding 5° C. but not more than 8° C., "C" when exceeding 8° C. but not more than 10° C., and "D" when exceeding 10° C.

The evaluation results are shown in Table 1 below.

TABLE 1

| | | Maximum Width of First Wick Part | | | | | | |
|---|---|---|---|---|---|---|---|---|
| | | 40% | 45% | 50% | 55% | 60% | 65% | 70% |
| Maximum Width of Second Wick Part | 60% | D | D | D | D | D | — | — |
| | 65% | D | B | B | B | B | C | — |
| | 70% | D | B | A | A | A | B | D |
| | 75% | D | B | A | A | A | B | D |
| | 80% | D | B | A | A | A | B | D |
| | 85% | D | B | A | A | A | B | D |
| | 90% | D | B | A | A | A | B | D |
| | 95% | D | C | B | B | B | B | D |
| | 100% | D | D | D | D | D | D | D |

From Table 1, it can be seen that when a maximum width of the first wick part relative to the maximum width in the direction (cross section) orthogonal to the lengthwise direction of the flat container is 45% to 65% and a maximum width of the second wick part relative to the maximum width in the direction (cross section) orthogonal to the lengthwise direction of the flat container is 65% to 95%, it gives at least evaluation C, which offers excellent heat transport characteristics with a favorable maximum heat transport amount and reduced thermal resistance. In particular, when a maximum width of the first wick part relative to the maximum width in the direction (cross section) orthogonal to the lengthwise direction of the flat container is 50% to 60% and a maximum width of the second wick part relative to the maximum width in the direction (cross section) orthogonal to the lengthwise direction of the flat container is 70% to 90%, it gives evaluation A, which offers extremely excellent heat transport characteristics.

INDUSTRIAL APPLICABILITY

The heat pipe of the present invention has, even when thin, excellent heat transport characteristics with a favorable maximum heat transport amount and low thermal resistance; thus, the heat pipe of the present invention has a high utilization value in fields such as the cooling of thin electronic components or the cooling of electronic components mounted at a high density, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A heat pipe having a heat receiving portion that is configured to be thermally connected to a heat generating member so as to absorb heat from the heat generating member, the heat pipe comprising:
   a flat container having a tube shape of which both ends are sealed, the flat container having a pair of flat inner surfaces that oppose each other in a vertical direction in cross sections perpendicular to a lengthwise direction of the flat container;
   a wick structure housed inside the flat container; and
   a working fluid sealed inside the flat container,
   wherein in at least one cross section of the flat container, the wick structure contacts both of the pair of flat inner surfaces of the flat container, and both side faces of the wick structure do not contact any of the inner surfaces of the flat container,
   wherein the wick structure has a first wick part and a second wick part, respectively disposed in the lengthwise direction of the flat container, the second wick part being directly or indirectly connected to the first wick part and having a maximum width that is wider than a maximum width of the first wick part,
   wherein the second wick part is disposed in the heat receiving portion of the heat pipe, and
   wherein the maximum width of the first wick part is 45% to 65% of a maximum width of an inner space of the flat container, and the maximum width of the second wick part is 65% to 95% of the maximum width of the inner space of the flat container.

2. The heat pipe according to claim 1, wherein a length of the second wick part in the lengthwise direction of the flat container is 2% to 50% of a sum of a length of the first wick part in the lengthwise direction of the flat container and a length of the second wick part in the lengthwise direction of the flat container.

3. The heat pipe according to claim 1,
   wherein in said at least one cross section of the flat container:
   a cross section of the wick structure has a flat bottom and a convex-shaped top,
   the convex-shaped top of the wick structure contacts one inner surface of the pair of flat inner surfaces, and
   the bottom contacts another inner surface of the pair of inner surfaces.

4. The heat pipe according to claim 3,
   wherein the second wick part of the wick structure is in said at least one cross section of the flat container, and
   wherein in said at least one cross section of the flat container, a maximum width of the bottom of the second wick part is 65% to 95% of a maximum width of an inner space of the flat container.

5. The heat pipe according to claim 1, wherein the first wick part is disposed on one end in the lengthwise direction of the flat container, and the second wick part is disposed on the other end in the lengthwise direction of the flat container.

6. The heat pipe according to claim 1, wherein there are two first wick parts, and one of the first wick parts is disposed on one end in the lengthwise direction of the flat container, and the other of the first wick parts is disposed on the other end in the lengthwise direction of the flat container, the second wick part being disposed in a center in the lengthwise direction of the flat container.

7. The heat pipe according to claim 1, further comprising a third wick part disposed between the first wick part and the second wick part in the lengthwise direction of the flat container, the third wick part having a maximum width that is wider than the maximum width of the first wick part and narrower than the maximum width of the second wick part.

8. The heat pipe according to claim 1, wherein in said at least one cross section of the flat container, the side faces of the wick structure that do not contact any of the inner surfaces of the flat container have a convex shape.

9. The heat pipe according to claim 1, wherein the first wick part and the second wick part are sintered metal compacts.

10. The heat pipe according to claim 9, wherein the sintered metal compact of the second wick part is formed of sintered powders having a finer particle size than sintered powders of the sintered metal compact of the first wick part.

11. The heat pipe according to claim 1, wherein the pair of flat inner surfaces opposing each other are vertically separated by a distance of 1.5 mm or less.

12. The heat pipe according to claim 1, wherein in every cross section of the wick structure, the wick structure contacts both of the pair of flat inner surfaces of the flat container, and both side faces of the wick structure do not contact any of the inner surfaces of the flat container.

13. The heat pipe according to claim 1, further comprising a thermally conductive member attached to the heat receiving portion of the heat pipe so as to be thermally connected to the heat generating member.

14. The heat pipe according to claim 1,
   wherein in a cross section of the flat container at the heat receiving portion of the heat pipe that is a different cross section from said at least one cross section of the flat container, the wick structure contacts only one of the pair of flat inner surfaces of the flat container, and both side faces of the wick structure do not contact any of the inner surfaces of the flat container.

* * * * *